US010984966B1

(12) United States Patent
Sherman et al.

(10) Patent No.: US 10,984,966 B1
(45) Date of Patent: Apr. 20, 2021

(54) CONFIGURABLE MICRO-ELECTRO-MECHANICAL SYSTEMS (MEMS) TRANSFER SWITCH AND METHODS

(71) Applicant: LOCKHEED MARTIN CORPORATION, Bethesda, MD (US)

(72) Inventors: Lowell Kent Sherman, Clarksville, GA (US); Bryan Charles Gundrum, Ocoee, FL (US); Steve Todd Nicholas, Montverde, FL (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 0 days.

(21) Appl. No.: 16/838,525

(22) Filed: Apr. 2, 2020

Related U.S. Application Data

(62) Division of application No. 15/656,756, filed on Jul. 21, 2017, now Pat. No. 10,643,800.

(Continued)

(51) Int. Cl.

| | | |
|---|---|---|
| *H01H 1/00* | (2006.01) | |
| *H05K 1/18* | (2006.01) | |
| *H05K 3/00* | (2006.01) | |
| *B81C 1/00* | (2006.01) | |
| *H01P 11/00* | (2006.01) | |

(Continued)

(52) U.S. Cl.
CPC ......... *H01H 1/0036* (2013.01); *B81B 7/0048* (2013.01); *B81C 1/00325* (2013.01); *H01P 1/127* (2013.01); *H01P 11/003* (2013.01); *H05K 1/181* (2013.01); *H05K 3/0047* (2013.01);

(Continued)

(58) Field of Classification Search
CPC ........ H01P 1/10; H01P 1/127; H01H 1/0036; H01H 1/181; H01H 1/182; H01H 1/1823; H01H 3/4697; H01H 1/11; H01H 7/20
See application file for complete search history.

(56) References Cited

U.S. PATENT DOCUMENTS 3,833,866 A    9/1974   Boutelant
4,399,439 A    8/1983   Upadhyayula
(Continued)

OTHER PUBLICATIONS

Majumder, S. et al., "An Electrostatically Actuated Broadband MEMS Switch," Radant MEMS, Incorporated, Microwave Symposium Digest, 2003 IEEE MTT-S International.

*Primary Examiner* — Dean O Takaoka
(74) *Attorney, Agent, or Firm* — Terry M. Sanks, Esq.; Beusse Sanks, PLLC

(57) ABSTRACT

A micro-electro-mechanical system (MEMS) transfer switch is disclosed. The transfer switch comprises a single-pole, N-throw switch section having N selectable switches. Each selectable switch of the N selectable switches has an input, a control terminal and an output. An electrically conductive line is coupled to each of the selectable switches of the N selectable switches. The transfer switch includes a single-pole, M-throw switch section having M selectable switches coupled to the conductive line, each selectable switch of the M selectable switches having an output, a control terminal and an input. The single-pole, N-throw switch section and the single-pole, M-throw switch section are packaged in a single micro-electro-mechanical system (MEMS) die. The N and M are numbers between two and eight and the N selectable switches and the M selectable switches are different switches.

12 Claims, 9 Drawing Sheets

Related U.S. Application Data

(60) Provisional application No. 62/364,983, filed on Jul. 21, 2016, provisional application No. 62/364,950, filed on Jul. 21, 2016.

(51) Int. Cl.
   *H01P 1/12* (2006.01)
   *B81B 7/00* (2006.01)
   *H05K 3/46* (2006.01)

(52) U.S. Cl.
   CPC ...... *H05K 3/4697* (2013.01); *B81B 2201/014* (2013.01); *H05K 2201/10053* (2013.01)

(56) References Cited

U.S. PATENT DOCUMENTS

| | | |
|---|---|---|
| 5,391,917 A | 2/1995 | Gilrnour et al. |
| 5,446,424 A | 8/1995 | Pierro |
| 6,525,650 B1 | 2/2003 | Chan et al. |
| 6,624,720 B1 | 9/2003 | Allison et al. |
| 6,849,924 B2 | 2/2005 | Allison et al. |
| 7,557,674 B2 | 7/2009 | Kamitsuna |
| 7,847,655 B2 | 12/2010 | Otani et al. |
| 8,245,390 B2 | 8/2012 | McKinley et al. |
| 8,659,326 B1 | 2/2014 | Claydon et al. |
| 9,432,298 B1 | 8/2016 | Smith |
| 10,218,397 B1 | 2/2019 | Gundrum et al. |
| 10,643,800 B1 * | 5/2020 | Sherman ................. H01P 1/127 |
| 2005/0224845 A1 | 10/2005 | Tayrani |
| 2007/0207761 A1 | 9/2007 | LaBerge et al. |
| 2009/0237179 A1 | 9/2009 | Chen |
| 2013/0048346 A1 * | 2/2013 | Mckinley ............... H05K 1/021 174/252 |

\* cited by examiner

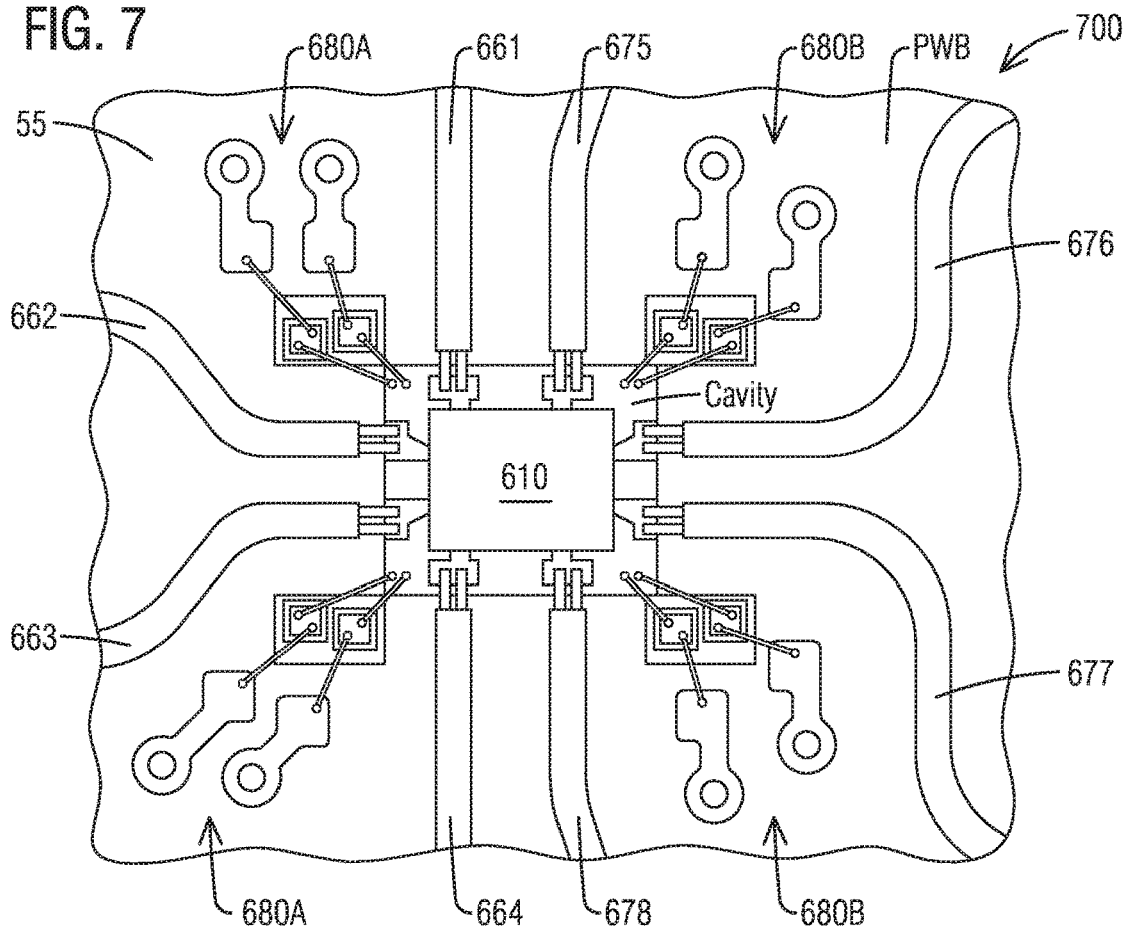
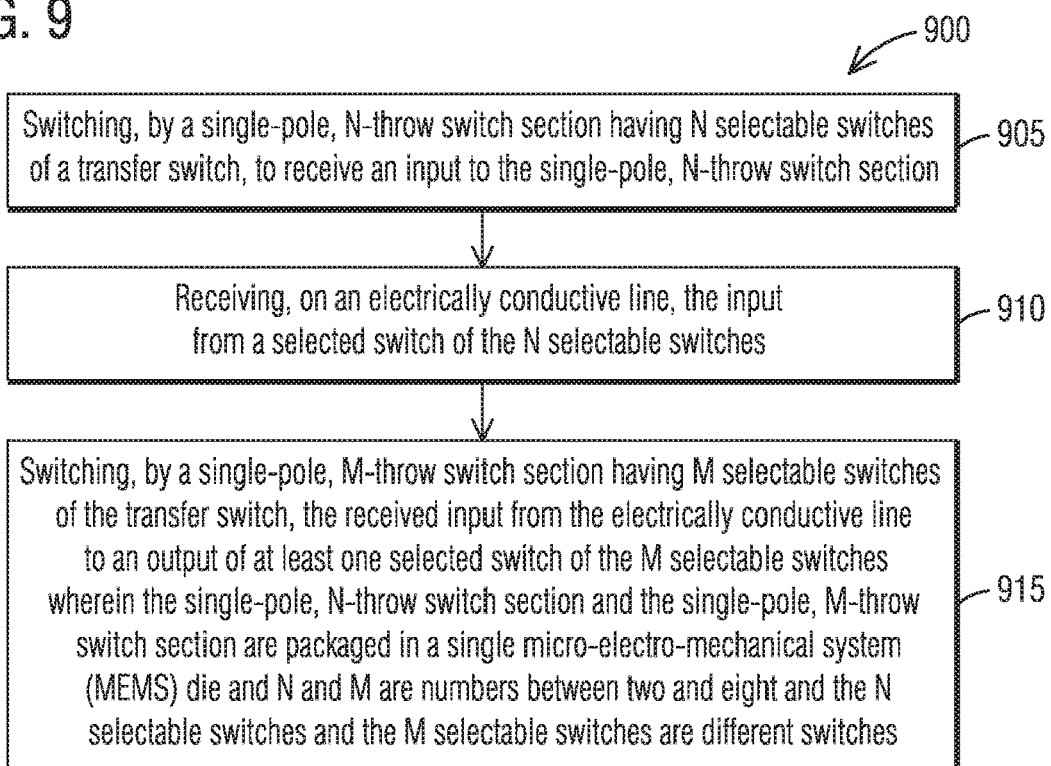

US 10,984,966 B1

CONFIGURABLE MICRO-ELECTRO-MECHANICAL SYSTEMS (MEMS) TRANSFER SWITCH AND METHODS

CROSS-REFERENCE TO RELATED APPLICATION

This application is a Divisional of U.S. application Ser. No. 15/656,756 filed Jul. 21, 2017, which claims the benefit of U.S. Provisional Application No. 62/364,983 filed Jul. 21, 2016, being assigned to a common assignee and incorporated herein by reference as if set forth in full below. This application also claims the benefit of U.S. Provisional Application No. 62/364,950 filed Jul. 21, 2016, being assigned to a common assignee and incorporated herein by reference as if set forth in full below.

BACKGROUND

The embodiments relate to micro-electro-mechanical systems (MEMS) transfer switches and methods.

A front-end of a receiver has challenges with additive noise of the electronics and protecting sensitive components from damage by high-power radio frequency (RF) signals. The solution has been to provide some front-end protection (e.g., RF limiter) and utilize the best available Monolithic Microwave Integrated Circuits (MMIC) components (e.g., switches and low noise amplifier (LNA)) in terms of insertion loss and RF power handling.

SUMMARY

Embodiments herein relate to an MEMS transfer switch and methods. An aspect of the embodiments includes a transfer switch comprising a single-pole, N-throw switch section having N selectable switches. Each selectable switch of the N selectable switches has an input, a control terminal and an output. An electrically conductive line is coupled to each of the selectable switches of the N selectable switches. The transfer switch includes a single-pole, M-throw switch section having M selectable switches coupled to the electrically conductive line. Each selectable switch of the M selectable switches has an output, a control terminal and an input. The single-pole, N-throw switch section and the single-pole, M-throw switch section are packaged in a single micro-electro-mechanical system (MEMS) die. The N and M are numbers between two and eight and the N selectable switches and the M selectable switches are different switches.

An aspect of the embodiments includes a method of assembling a micro-electro-mechanical system (MEMS) transfer switch on a printed wire board (PWB). The method comprises forming a PWB having a plurality of stacked layers wherein at least one layer being a CTE-matching layer of an engineered material having a configurable coefficient of thermal expansion (CTE) to provide substantial CTE matching with respect to a component to be mounted to the CTE matching layer. The method comprises ablating a cavity in the plurality of stacked layers to the CTE-matching layer; and attaching the MEMS transfer switch directly to the CTE-matching layer in the cavity. The transfer switch has input terminals and output terminals. The method comprises installing transmission lines as on a top layer of the PWB as input or output lines to the MEMS transfer switch; and attaching the input terminals and output terminals of the MEMS transfer switch to the transmission lines. The transfer switch comprises a single-pole, N-throw switch section and a single-pole, M-throw switch section packaged in a single micro-electro-mechanical system (MEMS) die. The N and M are numbers between two and eight.

An aspect of the embodiments includes a method comprising switching, by a single-pole, N-throw switch section having N selectable switches of a transfer switch, to receive an input to the single-pole, N-throw switch section. Each selectable switch of the N selectable switches has an input, a control terminal and an output. The method includes receiving, on an electrically conductive line, the input from a selected switch of the N selectable switches. The method includes switching, by a single-pole, M-throw switch section having M selectable switches of the transfer switch wherein each selectable switch of the M selectable switches has an input, a control terminal and an output, the received input from the electrically conductive line to the output of at least one selected switch of the M selectable switches. The single-pole, N-throw switch section and the single-pole, M-throw switch section are packaged in a single micro-electro-mechanical system (MEMS) die. The N and M are numbers between two and eight and the N selectable switches and the M selectable switches are different switches.

BRIEF DESCRIPTION OF THE DRAWINGS

A more particular description briefly stated above will be rendered by reference to specific embodiments thereof that are illustrated in the appended drawings. Understanding that these drawings depict only typical embodiments and are not therefore to be considered to be limiting of its scope, the embodiments will be described and explained with additional specificity and detail through the use of the accompanying drawings in which:

FIG. 7 illustrates a mounted bare die MEMS transfer switch according to an embodiment;

FIG. 9 illustrates a flowchart of a method of switching with an MEMS transfer switch.

DETAILED DESCRIPTION

Figure 1A:
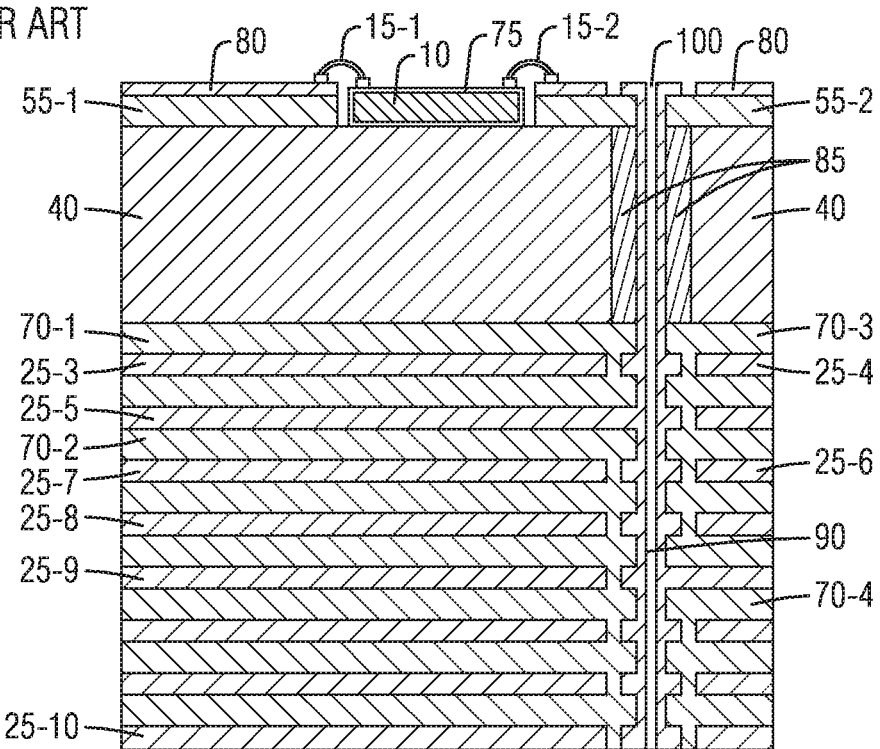
FIG. 1A is a cross-sectional diagram according to the prior art showing a PWB structure and a relative position of the CTE-matching layer.

Embodiments are described herein with reference to the attached figures wherein like reference numerals are used throughout the figures to designate similar or equivalent elements. The figures are not drawn to scale and they are provided merely to illustrate aspects disclosed herein. Several disclosed aspects are described below with reference to non-limiting example applications for illustration. It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. The embodiments are not limited by the illustrated ordering of acts or events, as some acts may occur in different orders and/or concurrently with other acts or events. Furthermore, not all illustrated acts or events are required to implement a methodology in accordance with the embodiments.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

The embodiments described herein incorporate techniques described in U.S. Pat. No. 8,245,390 to McKinley et al., and assigned to Lockheed Martin Corporation. The description of U.S. Pat. No. 8,245,390 is set forth below for understanding the manufacturing of parts of a printed wire board (PWB) used herein for the assembling of a micro-electro-mechanical system (MEMS) transfer switch on with the PWB.

The both die-form and surface mount device (SMD) packages for heat-generating integrated circuits (ICs) may require an in-plane coefficient of thermal expansion (CTE) as low as 7 to 10 ppm/° C. and a heat sink with thermal conductivity of 300 to 400 W/mK (Watts per meter Kelvin) or better. The CTE of Copper (Cu) is 17 ppm/° C. (parts per million per degree Centigrade), meaning that attaching an RF component directly to copper will likely cause either the solder joint or the package or the chip itself to crack from the repeated mechanical stresses of constant expansion and contraction.

Although the thermal conductivity of Copper is approximately 400 W/mK, this is not helpful because the typical thickness of metal layers in a PWB is approximately 1 mil. Having a thicker layer of metal would improve heat dissipation, but it would also increase the mechanical stresses caused by the CTE mismatch that exists between the metal and the IC components, as well as between the metal and non-metal layers of the PWB.

Recent advances in metallurgy and composite materials have resulted in the creation of engineered substances that have the electric and thermal properties of metals while exhibiting a CTE that can be tailored, based on their specific material composition, to be less than 10 ppm/° C. The use of such materials in constructing new types of PWBs that are better suited to hold radio frequency (RF) and other heat-generating components should be evaluated from a standpoint of using existing manufacturing technologies wherever possible, so that maximum advantage can be gained from the innovative use of the material while also providing cost savings over current module production practices.

The ability to combine in-plane CTE control and effective heat dissipation into a single layer of a printed wiring board (PWB) is made possible by the use of a relatively thick layer of engineered material as the layer 2 metallization of the PWB.

A primary aim of controlling the CTE of the layer 2 metallization is to provide a thermally dissipative surface for heat-generating IC components that is free from the usual mechanical stresses associated with the expansion and contraction of metal.

Because thermal conductivity is a function of thickness as well as surface area, it is important that the CTE-matching layer have a thickness sufficient to allow for heat dissipation without requiring the use of thermal vias or a module housing. The thickness of the CTE-matching layer is determined primarily by the heat dissipation requirements of the particular module being assembled and the thermal conductivity of the material used for the CTE-matching layer. This is further moderated by concerns for the overall thickness of the resultant PWB due to potential pre-existing size requirements, and the need to plate electrical via holes, which have a minimum height to diameter aspect ratio of 5:1. In some embodiments, the height to diameter aspect ratio may exceed 5:1.

One embodiment uses a Copper-Graphite composite material as the CTE-matching layer for a RADAR transceiver module. In this embodiment, it was also desirable that the engineered material be metal so that in addition to CTE matching and heat dissipation, the engineered material provided an RF ground for microwave ICs mounted to its surface. Portions of the CTE-matching layer used for surface mounting may be exposed by LASER ablation of the uppermost dielectric material in this embodiment.

Other embodiments may use different materials such as metallized ceramics depending on the specific CTE, thermal conductivity, and frequency performance desired. For applications that do not require frequency performance, the CTE-matching layer may not require any metal. The CTE-matching layers of these embodiments may also be exposed for surface applications by LASER ablation, or may use alternative techniques such as mechanical abrasion or etching.

The specific properties of interest of the Copper-Graphite material are its CTE of 7 ppm/° C. and thermal conductivity of 285-300 W/mK. Given the amount of heat generated from the components of an RF transceiver module, the appropriate thickness for the composite material was determined to be 40 mils, compared to the typical metallization layer in currently produced PWBs, which uses 1 oz. of Cu, for a thickness of approximately 1 mil. The Copper-Graphite material may have its CTE of 7 ppm/° C. and thermal conductivity may be 285-300 W/mK in the X-Y axis/plane and 210 W/mK in the Z-axis. In an application for installing of an MEMS transfer switch described later, the thickness of the composite material may be less than 40 mils based on the need for lower heat dissipation.

One property useful in embodiments of the method is compatibility with copper (Cu) or palladium (Pd) plating and industry-standard PWB fabrication processes. The ability to introduce the CTE-matching material into existing and widely used manufacturing processes is essential to material and cost saving PWB embodiments of the type disclosed herein.

FIG. 1A shows a cross-section of a PWB created in the composite material embodiment of the process. Heat-generating RF components 10 are attached to the PWB by means of eutectic solder in cavities 75 where the top substrate layer 55-1 and 55-2 of the PWB has been LASER ablated to expose the composite material comprising the layer 2 metallization 40 of the PWB. The RF components 10 are then connected to the top-layer metallization 80. In this embodiment, that connection is accomplished by using conventional wire-bonds 15-1 and 15-2 such as Thermosonic Gold wire. Alternative means of attaching and connecting the heat-generating RF components 10 may include conductive epoxy and wedge bonding, respectively. The manufacturing process resulting in the structure of FIG. 1A is discussed below.

FIGS. 2A-2E discuss the PWB stack-up process whereby the composite material layer is added to this embodiment of the process. Typically, PWBs are constructed of material cores (foil/dielectric/foil) that are laminated together using pregs (a dielectric glue to hold the cores together to form a core stackup). The processes for creating and laminating material cores together are known to individuals with ordinary skill in the art of PWB manufacture. The top layer of a PWB created according to an embodiment of the method would be a one-sided dielectric core (foil/dielectric) attached to the CTE-matching layer using a preg. An alternative embodiment may allow for simply covering the CTE-matching layer with a preg to prevent unwanted electrical contact with the CTE-matching layer. The techniques of using one-sided material cores and pregs in this fashion are also known to individuals with ordinary skill in the art of PWB manufacture.

Figure 2A:
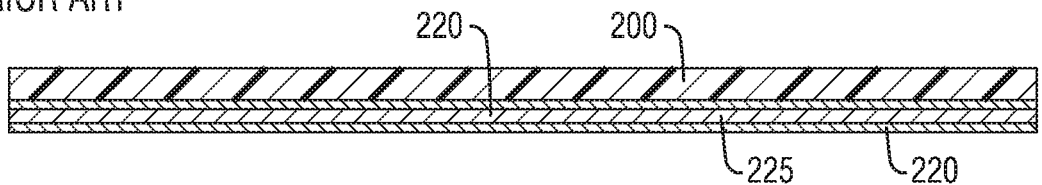
FIGS. 2A-2E are process diagrams illustrating a conventional method of manufacturing a PWB.

FIG. 2A begins with a PWB stack of Cu metallization 220 and an FR4 (flame retardant-4) substrate 225. Alternative embodiments of the method may use a substrate 225 comprised of various materials including ceramics, phenol based resin, Teflon, or fiberglass. Alternative embodiments of the method may also use an exotic metal such as palladium instead of copper, but this would greatly increase the cost of production. This portion of the stack is fabricated in a first lamination cycle according to lamination techniques known to individuals with ordinary skill in the art of PWB manufacture.

The topmost layer of substrate 200 is a high-performance laminate chosen, in this embodiment of the method, for its low loss high frequency dielectric properties. In other embodiments not meant for high frequency applications, an epoxy resin bonded glass fabric, such as the one known as FR-4, or any other possible lower-layer substrate could also be used as the topmost layer of substrate 200. Further, different frequency requirements could also necessitate the use of high performance laminates in the lower substrate layers 225 of the PWB in alternative embodiments.

After the first lamination cycle, the top core, the CTE-matching material, and a binding preg to attach the CTE-matching material to the rest of the PWB are laminated with the first lamination set to form a completed PWB.

Figure 2B:
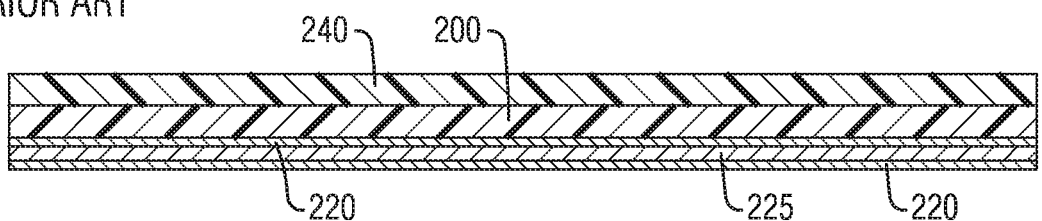
Figure 2C:
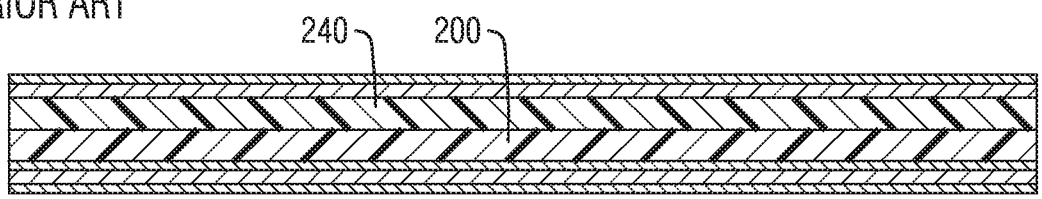

FIG. 2B demonstrates the addition of the composite material. Once the lower lamination set has been established/constructed, a preg layer, the predrilled and back filled CTE-matching material, and the top dielectric and foil (in foiled preg form) are added to the stack to form the final lamination set as depicted in FIG. 2C.

Figure 2D:
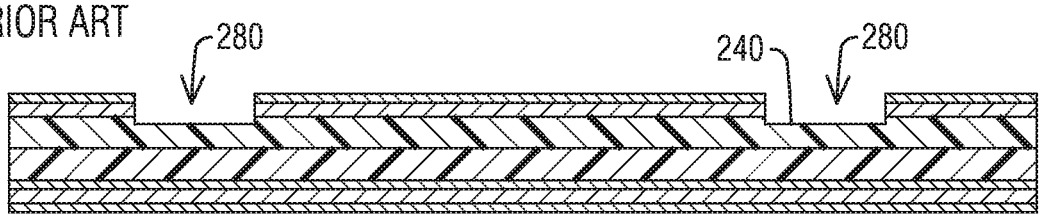
Figure 2E:
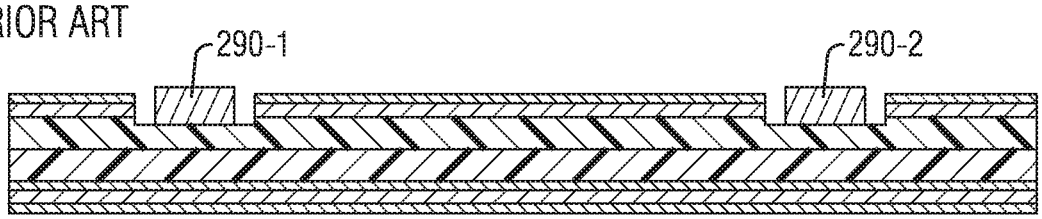

FIG. 2D shows a cross-section of the complete PWB stack created by this embodiment of the process and demonstrates the creation of the ablated cavities 280, which can be accomplished by a variety of methods including LASER ablation and mechanical cutting with a controlled depth router bit. These cavities expose the layer 2 metallization 240 for attachment of heat-generating parts 290-1 such as RF components 290-2 by means of epoxy attachment, soldering, or pressure-mountings depicted in FIG. 2E. Because this embodiment uses a metal as the layer 2 metallization, locations where electrically isolated vias are intended in the PWB must be identified before the CTE-matching layer can be inserted into the PWB stack.

The CTE-matching layer 40, because it cannot readily or easily be etched due to its thickness, may have holes drilled into it where the electrically isolated vias 100 are intended. These holes should be larger in diameter than the size of the intended via holes. The holes may be created by a variety of methods including mechanical or LASER drilling, they are then back-filled with an electrically non-conductive epoxy 85. Once the via holes are drilled through the PWB they are coated with electrically conductive material 90 by plating Copper along the inside the holes. The conductive material may also be introduced into the electrically isolated via hole by filling it with a conductive paste or other conductive material (such as solid silver) after the entire board stack is laminated. Because electrically isolated via 100 is drilled through the epoxy 85, the conductive material 90 lining the via hole 100 will remain electrically isolated from the metal in the CTE-matching layer 40.

FIGS. 3A-3D illustrate the drilling and epoxy-filling aspects of including a metal CTE-matching layer into a PWB where an electrically isolated via is intended. In this example, the CTE-matching material is assumed to be electrically conductive. Non-conductive embodiments of the CTE-matching material are not subjected to the drilling and epoxy-filling steps of the process.

Figure 3A:
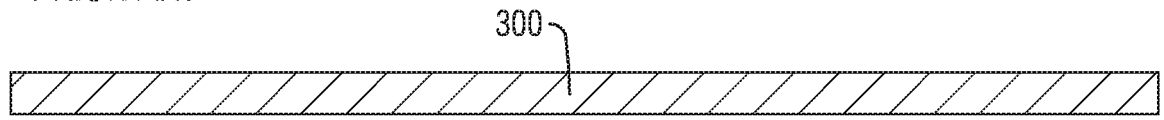
FIGS. 3A-3D are another set of process diagrams illustrating a conventional method of manufacturing a PWB.

FIG. 3A starts with a cross-section of the CTE-matching material 300 machined to the desired shape and thickness.

Figure 3B:
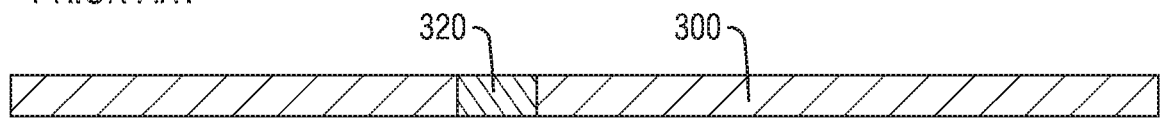

FIG. 3B illustrates a cross-section of the CTE-matching material 300 after it has the appropriate holes created in it by, in this embodiment, mechanical drilling. Holes of this type may be created in the CTE-matching layer by a variety of methods including mechanical or LASER drilling. After they are created, the holes are then filled with a non-conductive epoxy 320 and the epoxy is allowed to dry. The drying and curing procedures and times vary depending on the type of epoxy used, but will usually involve a thermal cycle with outgassing.

Figure 3C:
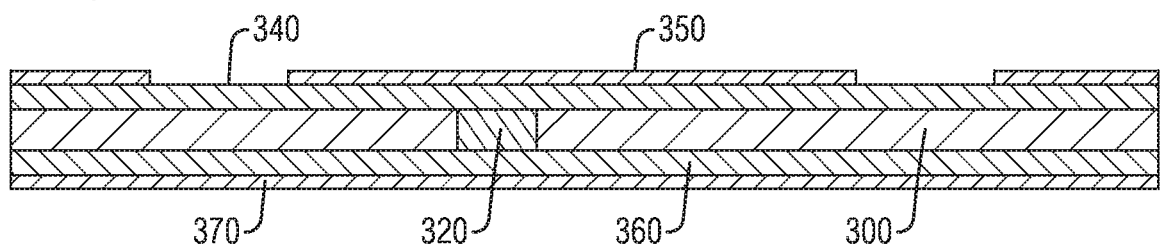

FIG. 3C illustrates a cross-section of an embodiment of a PWB stack based on the process. The CTE-matching layer 300, containing an epoxy-filled hole 320, is the layer 2 metallization of the PWB stack in this embodiment. The dielectric layer 340 and lower substrate layer 360 separate the CTE-matching layer 300 from the top layer metallization 350 and the lower layer metallization 370.

Figure 3D:
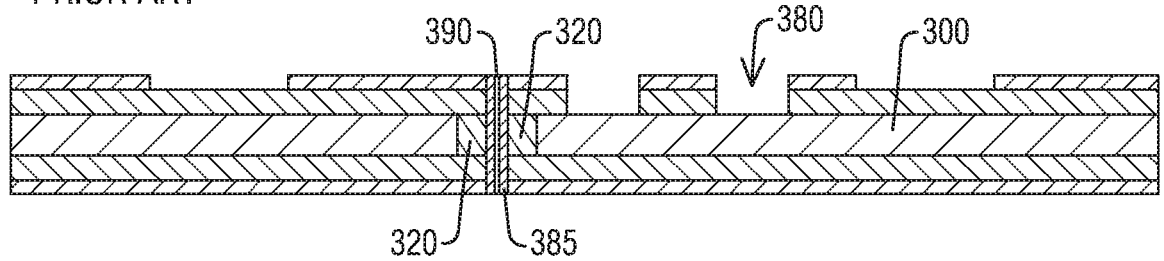

FIG. 3D illustrates a cross-section of an embodiment of a completed PWB stack based on the process. An electrically isolated via 390 has been created by drilling into the PWB stack in the location where the epoxy-filled hole, with non-conductive epoxy 320, was created in the CTE-matching layer 300.

After the via hole is created in the PWB, in this embodiment it is plated with copper 385 so that it will electrically connect the top and bottom metallization layers. Other methods of introducing conductive material into an electrical via hole include filling the hole with metallic paste, plating it solid with copper, or back-filling it with silver.

FIG. 3D also illustrates the ablated cavities 380 that are created to allow components to be mounted directly onto the CTE-matching layer 300. In this embodiment of the process, the cavities were created through LASER ablation. Other methods for creating cavities where the CTE-matching layer is exposed for attaching components to it include mechanical routing.

FIG. 1A illustrates the ablated cavities 75 in more detail. In this cross-sectional view, it is more clearly illustrated that the top metallization layer 25-1, 25-2, 25-3, 25-4, 25-6, 25-7, 25-8, 25-9 and 25-10 and the dielectric layer 55-1 and 55-2 are both ablated away to create the cavities where components may then be attached to the CTE-matching layer. In this embodiment of the process, a PWB for RF applications is being created. The dielectric layer 55-1 and 55-2 in this embodiment is made of a high-performance laminate chosen specifically for its dielectric properties whereas the lower substrate layers 70-1, 70-2, 70-3 and 70-4 may be made from less expensive material such as an epoxy resin bonded glass fabric (ERBGF) like FR-4, synthetic resin bonded paper (SRBP), ceramic, or Teflon. In other embodiments of the process, there may be no need for a specific dielectric layer 55-1 and 55-2 and all the non-metal layers may be substrate layers 70-1, 70-2, 70-3 and 70-4.

Figure 4A:
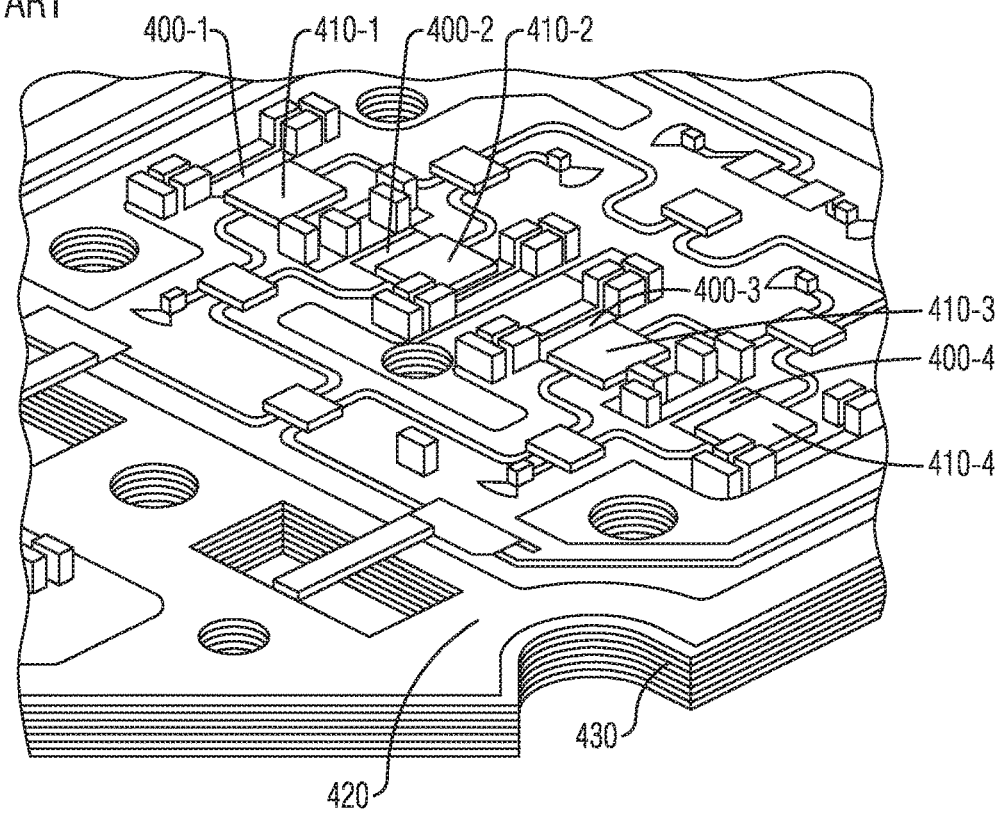
FIGS. 4A-4B compare a typical PWB to one manufactured.
Figure 4B:
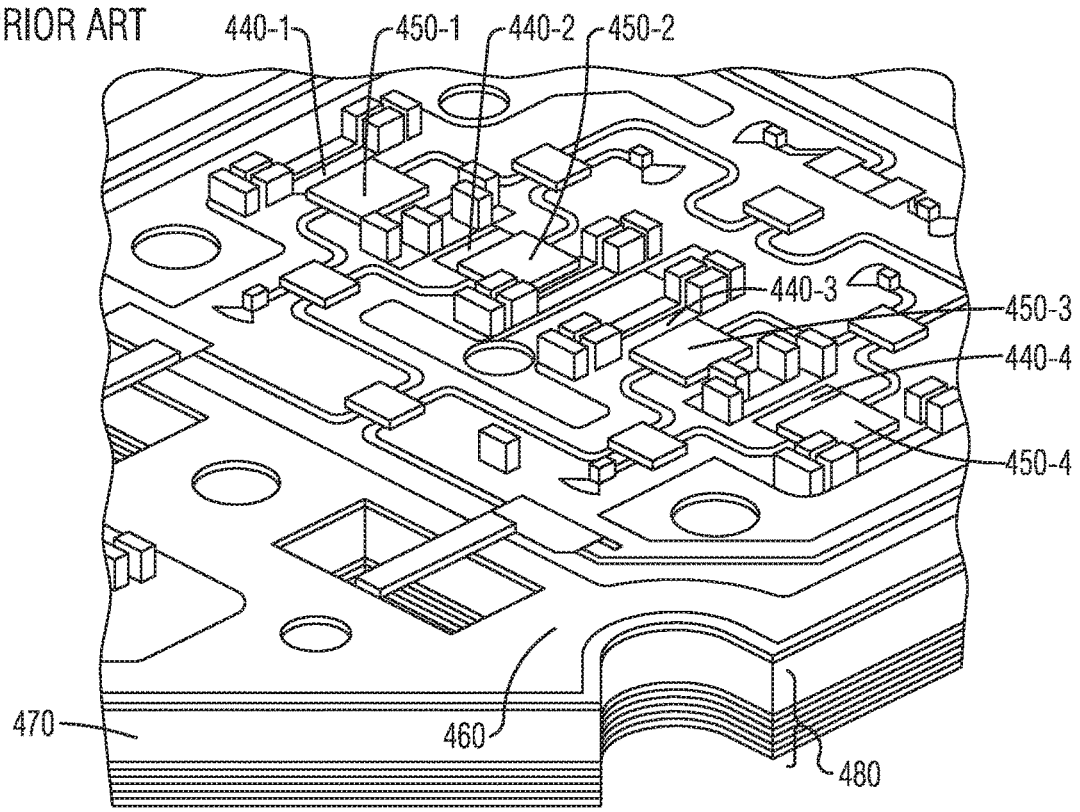

FIGS. 4A-4B present a comparison of two PWBs. FIG. 4A is a PWB produced according to current processes and technologies while FIG. 4B is a PWB produced according to an embodiment of the process.

Figure 1B:
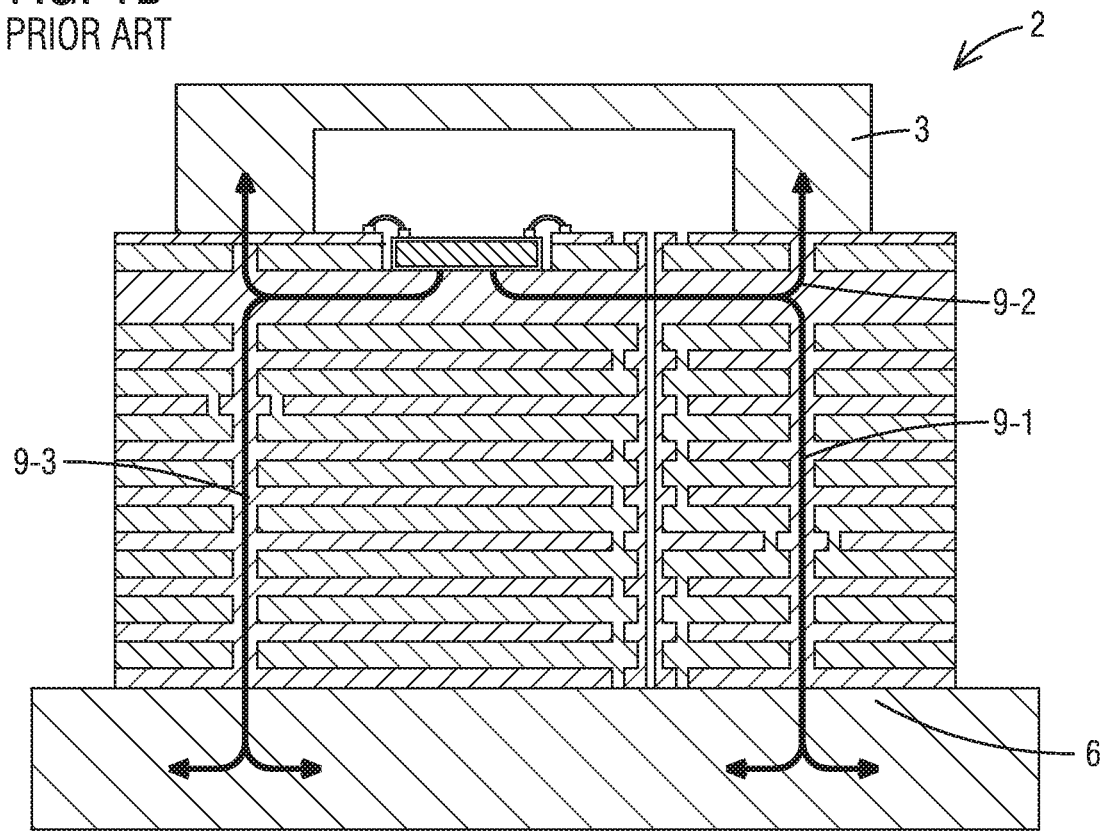
FIG. 1B is a cross-sectional diagram of a prior art PWB without a CTE-matching layer and with external heat sinks and thermal vias.

In FIG. 4A, the PWB stack 430 illustrated is one intended for RF applications. The layer 2 metallization 400-1, 400-2, 400-3 and 400-4 has been exposed by ablating away regions of the top metallization and dielectric layers 420. RF components 410-1, 410-2, 410-3 and 410-4 are attached directly to the layer 2 metallization 400-1, 400-2, 400-3 and 400-4 for purposes of RF grounding. The layer 2 metallization 400 is Copper and is between 0.7 and 1.4 mils thick, like all the metallization layers in the PWB. It does not provide any CTE matching or heat dissipation for the RF components, resulting in a reduced operating lifetime and creating a need for external heat sinks. FIG. 1B depicts a PWB 2 without a CTE-matching layer and with a top heat sink 3 and a bottom heat sink 6 and thermal vias 9-1 to channel heat up 9-2 to the top heat sink 3 and down 9-3 to the bottom heat sink 6.

In FIG. 4B, the PWB stack 480 illustrated is also one intended for RF applications. This PWB, however, was created according to an embodiment of the process. Here, the layer 2 metallization 440-1, 440-2, 440-3 and 440-4 has also been exposed by ablating away regions of the top metallization and dielectric layers 460. In this embodiment, however, the exposed layer 2 metallization 440-1, 440-2, 440-3 and 440-4 is the CTE-matching layer 470. The CTE-matching layer 470 introduced into the PWB in this embodiment of the process is a Copper-Graphite composite material and is 40 mils thick. It provides a ground plane for the RF components 450-1, 450-2, 450-3 and 450-4 that are attached directly to it and also matches the CTE of the RF components. Further, because of its thickness, it is capable of not only spreading, but also dissipating the heat generated by the attached RF components 450-1, 450-2, 450-3 and 450-4, eliminating the need for thermal vias and external heat sinks.

Figure 5:
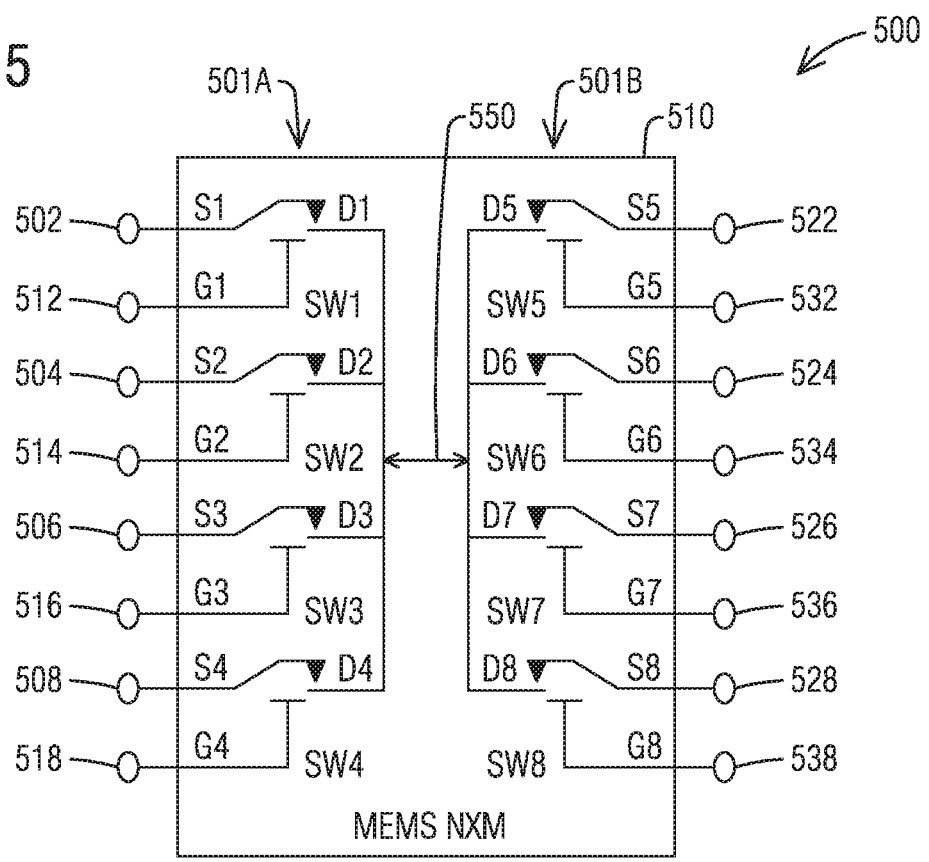
FIG. 5 illustrates a schematic diagram of an N×M configurable MEMS transfer switch according to an embodiment.

FIG. 5 illustrates a schematic diagram of an N×M configurable MEMS transfer switch 500. In the illustrations, N equal 4 and M equals 4. However, N may be 3 and M may be 5. The number of inputs and outputs may vary, but may be less than 8 and more than 2. As can be appreciated, the number of N and M may be more than 8 such as 10-20. The transfer switch 500 includes a single-pole, N-pole (SPNT) switch section 501A and a single-pole, M-pole (SPMT) switch section 501B. For the 4×4 configuration, the transfer switch 500 includes a first single-pole, four-throw (SP4T) switch section 501A and a second single-pole, four-throw (SP4T) switch section 501B housed in a die 510. By way of non-limiting example, the transfer switch 500 may be a bare die component. The transfer switch 500 may be manufactured in an unpackaged MEMS transfer switch die. The die may be a single die. The description below describes an implementation of 4×4 where N=4 and M=4 for illustrative purposes, but not meant to be limiting.

The first SP4T switch section 501A will be described using symbology in analogous field effect transistor (FET) notation (i.e., source (S), drain (D) and gate (G) pins). Moreover, the source (S) and drain (D) are electrically connected by a cantilever arm when the switch is in an activated state. In an unactivated state, the cantilever arm is configured to not complete an electrical connection between the source (S) and drain (D). In other words, the remaining cantilever arms of the unactivated switches remain open.

The first SP4T switch section 501A includes N individually selectable switches within denoted dashed boxes. The individually selectable switches include a first switch SW1, a second switch SW2, a third switch SW3 and a fourth switch SW4. For an N=3, the first switch section would be an SP3T switch section with three switches, for example. For N=5, the first switch section would be an SPST switch section with five switches, for example.

The first switch SW1 includes source S1, gate G1 and drain D1. The source S1 is coupled to a terminal 502 and gate G1 is coupled to terminal 512. The drain D1 is coupled to a line 550. Line 550 may be a bi-directional line.

The second switch SW2 includes source S2, gate G2 and drain D2. The source S2 is coupled to a terminal 504 and gate G2 is coupled to terminal 514. The drain D2 is coupled to the line 550.

The third switch SW3 includes source S3, gate G3 and drain D3. The source S3 is coupled to a terminal 506 and gate G3 is coupled to terminal 516. The drain D3 is coupled to the line 550.

The fourth switch SW4 includes source S4, gate G4 and drain D4. The source S4 is coupled to a terminal 508 and gate G4 is coupled to terminal 518. The drain D4 is coupled to the line 550.

In an embodiment, each of the N (four) switches SW1, SW2, SW3 and SW4 is individually controlled by a switch actuator voltage applied to any one of gates G1, G2, G3 and G4, respectively. Specifically, a switch actuator voltage applied to one of gates G1, G2, G3 and G4 causes a cantilever arm of the selected gate to close thereby completing electrical connections of the source and the drain associated with the actuated gate along desired paths.

The second SP4T switch section 501B includes M individually selectable switches within denoted dashed boxes. The individually selectable switches include a fifth switch SW5, a sixth switch SW6, a seventh switch SW7 and an eighth switch SW8. As can appreciated, the fifth, sixth, seventh and eighth switches are first, second, third and fourth switches, respectively, in the second SP4T switch section 501B. For an M=3, the second switch section would be an SP3T switch section with three switches, for example. For M=5, the second switch section would be an SPST switch section with five switches, for example. The switches in section 501A and switches in section 501B are different switches.

The fifth switch SW5 includes source S5, gate G5 and drain D5. The source S5 is coupled to a terminal 522 and gate G5 is coupled to terminal 532. The drain D5 is coupled to the line 550.

The sixth switch SW6 includes source S6, gate G6 and drain D6. The source S6 is coupled to a terminal 524 and gate G6 is coupled to terminal 534. The drain D6 is coupled to the line 550.

The seventh switch SW7 includes source S7, gate G7 and drain D7. The source S7 is coupled to a terminal 526 and gate G7 is coupled to terminal 536. The drain D7 is coupled to the line 550.

The eighth switch SW8 includes source S8, gate G8 and drain D8. The source S8 is coupled to a terminal 528 and gate G8 is coupled to terminal 538. The drain D8 is coupled to the line 550.

In an embodiment, each of the M (four) switches SW5, SW6, SW7 and SW8 is individually controlled by a switch actuator input or voltage applied to any one of gates G5, G6, G7 and G8, respectively. Specifically, a switch actuator input or voltage applied to one of gates G5, G6, G7 and G8 causes a cantilever arm of the selected gate to close thereby completing electrical connections between the source and the drain associated with the actuated gate along desired paths. The remaining cantilever arms of the unactivated switches remain open.

In an embodiment, the first SPNT switch section 501A is a mirror image of the second SPMT switch section 501B such as when N and M are equal.

The MEMS N×M transfer switch 500 has low noise receiver applications and provides enhanced functionality and, with respect to certain parameters, superior RF performance to that of other competing technology, commercial off-the-shelf (COTS) components.

The MEMS N×M transfer switch 500 may be configured for lower insertion loss which directly translates into improved receiver sensitivity. Additionally, the MEMS transfer switch 500 operates across a wide frequency bandwidth, has a high dynamic range and can handle relatively high RF power levels, especially true under cold-switched conditions (i.e., switching occurs in absence of incident RF power).

The MEMS N×M transfer switch 500 enables selection of one of several inputs and transfers the input signal to one of several outputs. In RF receiver applications, this may be utilized to selectively scan multiple antenna inputs and appropriately condition the level of incident signals for subsequent processing.

Figure 6A:
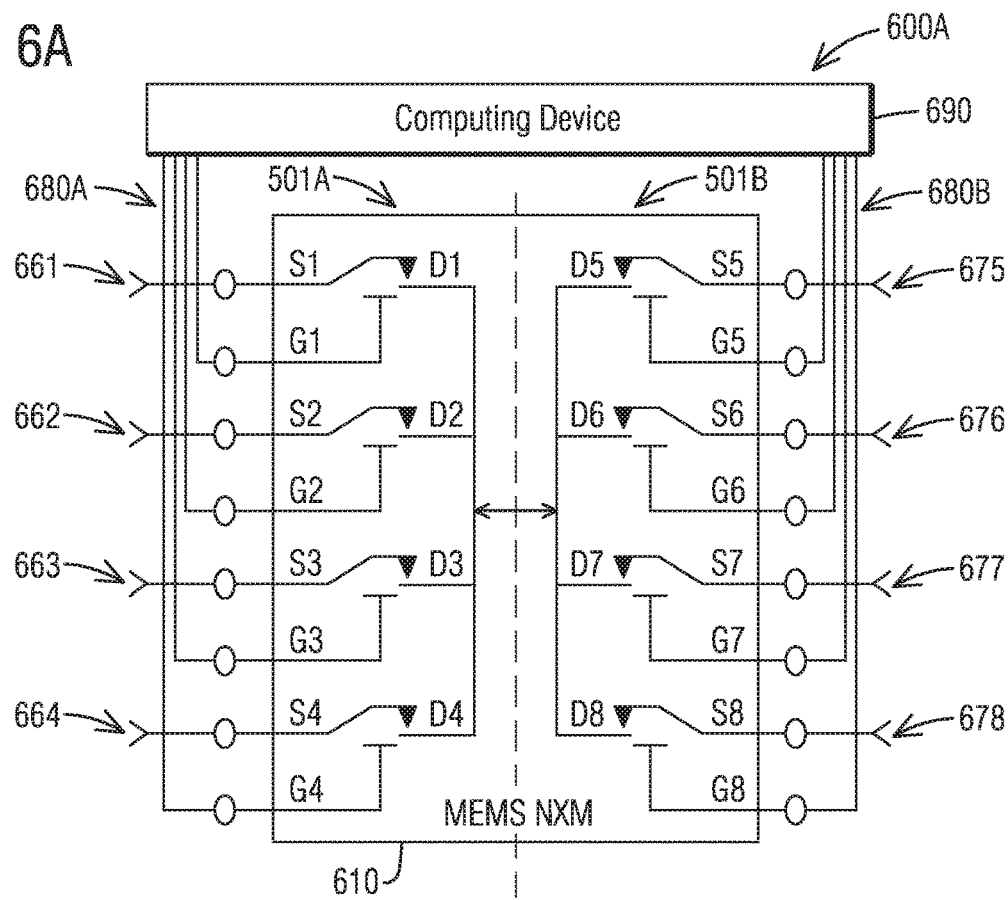
FIG. 6A illustrates a configuration of the MEMS transfer switch of FIG. 5 according to an embodiment.

FIG. 6A illustrates a configuration of the MEMS transfer switch of FIG. 5. For the sake of brevity, only features of the configuration will be described. In the configuration of FIG. 6A, the first SP4T switch section 501A is configured as the input side of the MEMS transfer switch 600A and the second SP4T switch section 501B is configured as the output side. The SP4T switch section 501A is connected to input lines 661, 662, 663 and 664. The SP4T switch section 501B is connected to output lines 675, 676, 677 and 678. The MEMS transfer switch 600A is incorporated into a die 610. The die may be an unpackaged die or open die.

The transfer switch may be fabricated by deposition of metals and other materials onto a "base" substrate material (e.g., silicon) just like with other integrated circuits (ICs). This device is "open die" or unpackaged. Typically, the die may be mounted onto the PWB (CTE matched metal in cavity) using conductive epoxy and wire-bond interconnecting transmission lines and actuating voltage control points.

The die however could, in an embodiment, be encapsulated into a package (e.g., ceramic or plastic) with electrical leads that are then soldered, i.e., SMD. The packaging adds undesired "parasitics" that add loss and reduce operating bandwidth.

Specifically, at the input side, source S1 is configured to receive an input on input line 661; source S2 is configured to receive an input on input line 662; source S3 is configured to receive an input on input line 663; and source S4 is configured to receive an input on input line 664. The gates G1, G2, G3 and G4 are configured to receive a switch actuator input or voltage on one of the plurality of lines 680A to the corresponding gate terminal. The switch actuator input or voltage may be generated by a driver circuit (not shown) controlled by a computing device 690, as will be described in more detail in FIG. 8. Any one of the switches SW1, SW2, SW3 and SW4 may be selected by the application of a switch actuator input or voltage on the corresponding gate. For example, supplying a switch actuator input or voltage on the terminal for gate G2 causes activation of switch SW2. Thereby, the cantilever arm of switch SW2 closes to complete an electrical connections of the source S2 and the drain D2. The signal on input 662 would be able to flow through the switch SW2 through the drain D2 and to line 550. Each of the switches SW1, SW3 and SW4 operates and being activated in a similar manner as described in relation to switch SW2.

At the output side, source S5 is configured to produce an output on output line 675; source S6 is configured to produce an output on output line 676; source S7 is configured to produce an output on output line 677; and source S8 is configured produce an output on output line 678. The gates G5, G6, G7 and G8 are configured to receive a switch actuator input or voltage on one of the plurality of lines 680B at a corresponding gate terminal. The switch actuator input or voltage 680B may be generated by a computing device 690. Any one of the switches SW5, SW6, SW7 and SW8 may be selected by the application of a switch actuator input or voltage 680B on the corresponding gate. For example, supplying a switch actuator input or voltage on gate G7 causes activation of switch SW7. Thereby, the cantilever arm of switch SW7 closes to complete an electrical connections of the source S7 and the drain D7. The signal flowing through line 550 passes through the switch SW7 through the drain D7 and source S7 to output line 677.

In operation, only one of switches SW1, SW2, SW3, and SW4 is selected at a time such that only a signal on one of the input lines 661, 662, 663 and 664 is passed through line 550 to the second SP4T switch section 501B.

Turning now to second SP4T switch section 501B, the computing device 690 may select any one of the switches SW5, SW6, SW7 and SW8 by the application of a switch actuator input or voltage to the corresponding gate terminal to generate a corresponding output on one of the output lines 675, 676, 677 and 678.

In the configuration of FIG. 6A, the input lines may be associated with one or more antenna. In one embodiment, each input line 661, 662, 663 and 664 may be coupled to a corresponding antenna. Thus, the transfer switch 600A may selectively pass one of four different input signals from a different antenna.

The input side of the transfer switch 600A may selectively receive one of a plurality of N possible inputs (i.e., lines 661, 662, 663 and 664) and generates a single output on line 550. The output side of the transfer switch 600 receives the single output on line 550 and generates an output on one of a plurality of M selectable output paths (i.e., lines 675, 676, 677 and 678). Thus, the transfer switch 500 may be configured such that the input side and output sides are reversible. Hence, the SP4T switch section 501B may be the input side and SP4T switch section 501A may be the output side. The operation would operate in a similar manner as previously described. For example, an input on one of lines 675, 676, 677 and 678 would pass through a selected switch to line 550. Then, one of the switches in SP4T switch section 501A would be selected to output the signal from SP4T switch section 501B on one of the lines 661, 662, 663, and 664.

In yet another configuration, the MEMS transfer switch 500 may be controlled to selectively switch the SP4T switch section 501A between the inputs side configuration to the output side configuration. Likewise, the SP4T switch section 501B may be controlled to selectively switch between the output side configurations to the input side. This configuration has application for transceivers.

In yet another configuration, the switch section SP4T 501A and switch section SP4T 501B of MEMS transfer switch 500 may alternate between an input side operation and an output side operation under the control of computing device 690. For example, one or more of the input lines of the SP4T switch section 501A may be designated as an output line with at least one input line maintained as an input line. Additionally, one or more of the output lines of the SP4T switch section 501B may be designated as an input line with at least one output line maintained as an output line. Therefore, the MEMS transfer switch 600A may function as a two-way transfer switch such that line 550 is a bi-lateral (bi-directional) communication line. In this configuration, the two-way communications do not take place simultaneously. In other words, one or more of lines 661, 662, 663 and 664 to the transfer switch may be an input and the remaining lines may be outputs. Likewise, one or more of lines 675, 676, 677 and 678 may be an output and the remaining lines may be inputs. The inputs and outputs flow through line 550 based on the switching control by the computing device 690.

Figure 6B:
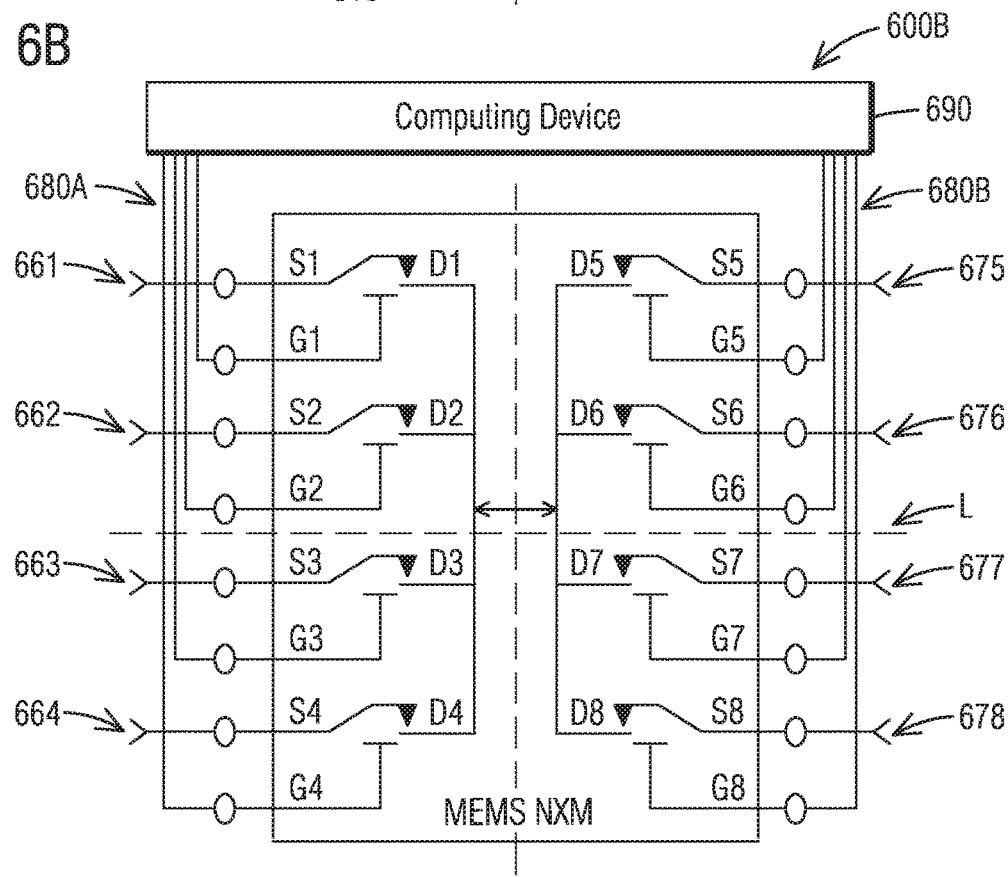
FIG. 6B illustrates another configuration of the MEMS transfer switch of FIG. 5 according to an embodiment.

FIG. 6B illustrates another configuration of the MEMS transfer switch of FIG. 5 according to an embodiment. The MEMS N×M transfer switch of FIG. 5 will be described for illustrative purposes as a 4×4 transfer switch with N=M=4. In FIG. 6B, the transfer switch 600B is represented as being divided by line L such that at least one switch from section 501A and at least one switch from section 501B is above line L. Additionally, at least one switch from section 501A and at least one switch from section 501B is below line L. In the illustration, two switches are above line L in each of the sections 501A and 501B and two switches are below line L in each of the sections 501A and 501B. In this example, the number of switches above line L in sections 501A and 501B may be used as transmit paths. Then, the number of switches below line L in sections 501A and 501B may be used as receive paths. The transmit paths and receive paths are communicated across line 550, but not simultaneously. In other words, line 550 does not support duplex communications. Instead, the control signals to the transfer switch will control the timing of the opening and closing the switches with the direction of signals presented at the transfer switch 600B.

In view of the description herein, if only one switch is above line L then there would be three switches below line L for a 4×4 transfer switch. Other configurations are possible, based on the configuration scheme implemented.

In a further configuration, switch section 501A may produce only one output to line 550 regardless of the number of N inputs and N switches. However, the switch section 501B may be operated such that two or more of the M switches are activated to be closed simultaneously. In such a configuration, the signal from switch section 501A to switch section 501B would be divided across the number X of M switches selected to be closed simultaneously where X may be selected to be between 1 and M. For example, if a selected input through switch section 501A is sent to two closed switches in switch section 501B, then the power is divided between those closed switch paths. The output lines from these switches may have impedance matched elements. As another example, if three of the switches are closed, the input signal from switch section 501A would be divided across the three closed switches in switch section 501B. The reverse is also possible such that a signal received at a switch in section 501B may be divided across those paths selected to be output paths in section 501A.

FIG. 7 illustrates a mounted bare die MEMS transfer switch 700 installed in an ablated cavity of a PWB. The PWB is a single PWB that is used for RF components and other components. Top layer 55 (i.e., 55-1 and 55-2) is shown with a cavity formed through the top layer 55-1 and 55-2. The reference numerals used in the explanation of transfer switch 600A in FIG. 6A is used for like parts in FIG. 7 for the sake of brevity. Thus, the description above in relation to FIG. 6A using FET terms can be applied to the MEMS implementation illustrated in FIG. 7.

In an embodiment, an MEMS transfer switch 700 may be configured for radio frequency (RF) frequencies and can be implemented on a wiring board adapted to a hybrid microwave integrated circuit configuration. The printed wiring board (PWB) is employed enabling use of a bare die N×M MEMS transfer switches in a hybrid microwave integrated circuit (MIC) configuration. The MEMS transfer switch is configured to switch radio frequency (RF) signals therethrough.

The PWB employs a buried layer of coefficient of thermal expansion (CTE) matched metal. MEMS switch die 610 when installed may be situated or disposed in cavities, laser ablated through the surface RF dielectric layer, mounted directly to the CTE matched metal and wire bonded to adjacent transmission lines (input lines 661, 662, 663 and 664 and lines 675, 676, 677 and 678) that interconnect with other die components for input or output. The "other" die components may be RF die components. The adjacent transmission lines (input lines 661, 662, 663 and 664 and lines 675, 676, 677 and 678) may be metal and may be attached to the top layer 55-1 and 55-2 of the PWB.

The PWB configuration may provide mechanical stability for the die components, essential for reliable operation under extreme temperature excursions, and enables co-location of bare die RF components, such as MEMS and other integrated circuits (IC's), along with ancillary surface mount (SMT) components resulting in a relatively low cost, integrated PWB assembly.

An unpackaged MEMS switch die 610 may be used in a low noise RF receiver front-end. While packaging of electronic components using, for example, plastic or ceramic encapsulation, is desirable for a number of reasons, it presents parasitic effects that invariably degrade RF performance. Insertion loss increases and operating frequency bandwidth is reduced.

The MEMS transfer switch configuration includes two back-to-back single-pole, four-throw switches integrated in die form and may reduce insertion loss.

The bare die MEMS transfer switch and Monolithic Microwave Integrated Circuits (MMIC) components coexist with Surface Mount (SMT) components on a single printed wiring board assembly. Production cost and size envelope of RF electronics using separate assemblies for RF and analog/digital/power circuit card assembly (CCA), typical of traditional hybrid MIC configurations, are reduced using a multi-layer PWB with integrated, coefficient of thermal expansion (CTE) matched metal.

The N×M MEMS transfer switch allows flexibility to select between multiple inputs (e.g., antennas) and direct the signal to one of several outputs, in one configuration. In another configuration, the flexibility allows the MEMS transfer switch to function as a two-way switch, but not in full-duplex operation.

The N×M MEMS transfer switch has lower insertion loss than other types of RF switches. Under certain conditions, the MEMS transfer switch can withstand significantly higher incident RF power, precluding the need of a limiter. The result may be significantly reduced noise figure and increased receiver sensitivity. The MEMS transfer switch also has application for sensor platforms which require low noise reception.

The N×M MEMS transfer switch configuration provides further performance enhancements for receivers requiring a flexible switching topology (e.g., receiving multiple antenna inputs and providing multiple output paths). Additionally, the multi-layer PWB/CTE matched metal integrated assembly reduces volume and cost.

The PWB is employed using buried layers of coefficient of thermal expansion (CTE) matched metal allowing for direct die attachment of bare die MEMS switches (and other desirable MMIC die components). Thus, the MEMS transfer switch die to be co-located with surface mount (SMT) type components into a single integrated PWB assembly.

Returning again to FIG. 1A, the MEMS transfer switch die 610 may be installed in a similar manner as the RF components 10. The MEMS die may be attached using bare die bonding methods to attach the MEMS die to the PWB by means of, by way of non-limiting example, eutectic solder in cavities where the top substrate layer 55-1 and 55-2 of the PWB has been LASER ablated to expose the composite material comprising the layer 2 metallization 40 of the PWB. Other bare die methods of attachments may be used such as without limitation, including solder and adhesives.

Figure 8:
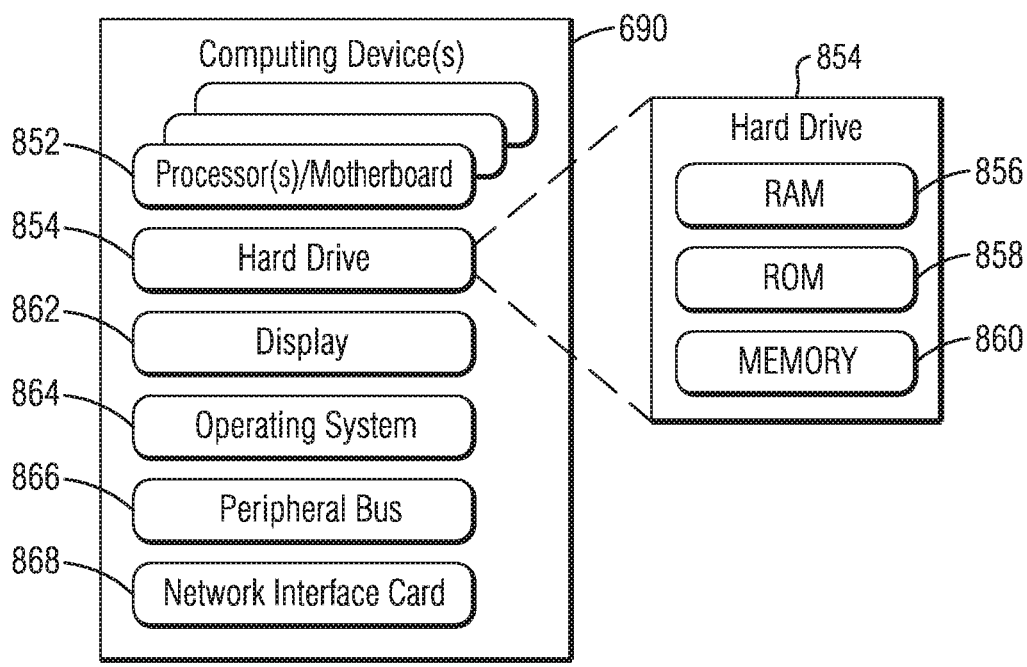
FIG. 8 illustrates a block diagram of a computing device.

Referring now to FIG. 8, in a basic configuration, the computing device 690 may include any type of stationary computing device or a mobile computing device. The computing device may be a computing system with one or more servers, each server including one or more processors. The term computing device and computing system may be interchangeable.

Computing device 690 may include one or more processors 852 and system memory in hard drive 854. Depending on the exact configuration and type of computing device, system memory may be volatile (such as RAM 856), non-volatile (such as read only memory (ROM 858), flash memory 860, and the like) or some combination of the two. System memory may store operating system 864, one or more applications, and may include program data for performing the processes described herein. Computing device 690 may also have additional features or functionality. For example, computing device 690 may also include additional data storage devices (removable and/or non-removable) such as, for example, magnetic disks, optical disks, or tape. Computer storage media may include volatile and non-volatile, non-transitory, removable and non-removable media implemented in any method or technology for storage of data, such as computer readable instructions, data structures, program modules or other data. System memory, removable storage and non-removable storage are all examples of computer storage media. Computer storage media includes, but is not limited to, RAM, ROM, Electrically Erasable Read-Only Memory (EEPROM), flash memory or other memory technology, compact-disc-read-only memory (CD-ROM), digital versatile disks (DVD) or other optical storage, magnetic cassettes, magnetic tape, magnetic disk storage or other magnetic storage devices, or any other physical medium which can be used to store the desired data and which can be accessed by computing device. Any such computer storage media may be part of device.

Computing device 690 may also include or have interfaces for input device(s) (not shown) such as a keyboard, mouse, pen, voice input device, touch input device, etc. The computing device 690 may include or have interfaces for connection to output device(s) such as a display 862, speakers, etc. The computing device 690 may include a peripheral bus 866 for connecting to peripherals. Computing device 690 may contain communication connection(s) that allow the device to communicate with other computing devices, such as over a network or a wireless network. By way of example, and not limitation, communication connection(s) may include wired media such as a wired network or direct-wired connection, and wireless media such as acoustic, radio frequency (RF), infrared and other wireless media. The computing device 690 may include a network interface card 868 to connect (wired or wireless) to a network.

Computer program code for carrying out operations described above may be written in a variety of programming languages, including, but not limited to, a high-level programming language, such as without limitation, Java, C or C++, for development convenience. In addition, computer program code for carrying out operations of embodiments described herein may also be written in other programming languages, such as, but not limited to, interpreted languages. Some modules or routines may be written in assembly language or even micro-code to enhance performance and/or memory usage. It will be further appreciated that the functionality of any or all of the program modules may also be implemented using discrete hardware components, one or more application specific integrated circuits (ASICs), or a programmed Digital Signal Processor (DSP) or microcontroller. A code in which a program of the embodiments is described can be included as a firmware in a RAM, a ROM and a flash memory. Otherwise, the code can be stored in a tangible computer-readable storage medium such as a magnetic tape, a flexible disc, a hard disc, a compact disc, a photo-magnetic disc, a digital versatile disc (DVD).

The embodiments may be configured for use in a computer or a data processing apparatus which includes a memory, such as a central processing unit (CPU), a RAM and a ROM as well as a storage medium such as a hard disc.

FIG. 9 illustrates a flowchart of method 900 of switching with an N×M MEMS transfer switch. The blocks of the methods described herein may be performed in the order shown or a different order. One or more of the blocks may be deleted and blocks may be added. Blocks may be performed contemporaneously.

At block 905, the method 900 may include switching, by a single-pole, N-throw switch section having N selectable switches, to receive an input to the single-pole, N-throw switch section. At block 910, the method 900 may include receiving, on an electrically conductive line, the input from a selected switch of the N selectable switches. At block 915, the method 900 may include switching, by a single-pole, M-throw switch section having M selectable switches of the transfer switch, the received input from the electrically conductive line to the output of at least one selected switch of the M selectable switches. Each selectable switch of the M selectable switches has an input, a control terminal and an output. The single-pole, N-throw switch section and the single-pole, M-throw switch section are packaged in a single micro-electro-mechanical system (MEMS) die. The N and M are numbers between two and eight and the N selectable switches and the M selectable switches are different switches.

FIGS. 10A-10D illustrate flowcharts of a method 1000 of assembling a micro-electro-mechanical system (MEMS) transfer switch on a printed wire board (PWB). With specific reference to FIG. 10A, the method 1000 may include, at block 1002, forming a PWB having a plurality of stacked layers wherein at least one layer being a CTE-matching layer of an engineered material having a configurable coefficient of thermal expansion (CTE) to provide substantial CTE matching with respect to a component to be mounted to the CTE matching layer. At block 1004, the method 1000 may include ablating a cavity in the plurality of stacked layers to the CTE-matching layer. At block 1006, the method 1000 may include attaching the MEMS transfer switch directly to the CTE-matching layer in the cavity, the transfer switch having input terminals and output terminals. At block 1008, the method 1000 may include installing transmission lines on a top layer of the PWB as input or output lines to the MEMS transfer switch. At block 1010, the method 1000 may include attaching the input terminals and output terminals of the MEMS transfer switch to the transmission lines wherein transfer switch comprises a single-pole, N-throw switch section and a single-pole, M-throw switch section packaged in a single micro-electro-mechanical system (MEMS) die and N and M are numbers between two and eight.

Figure 10A:
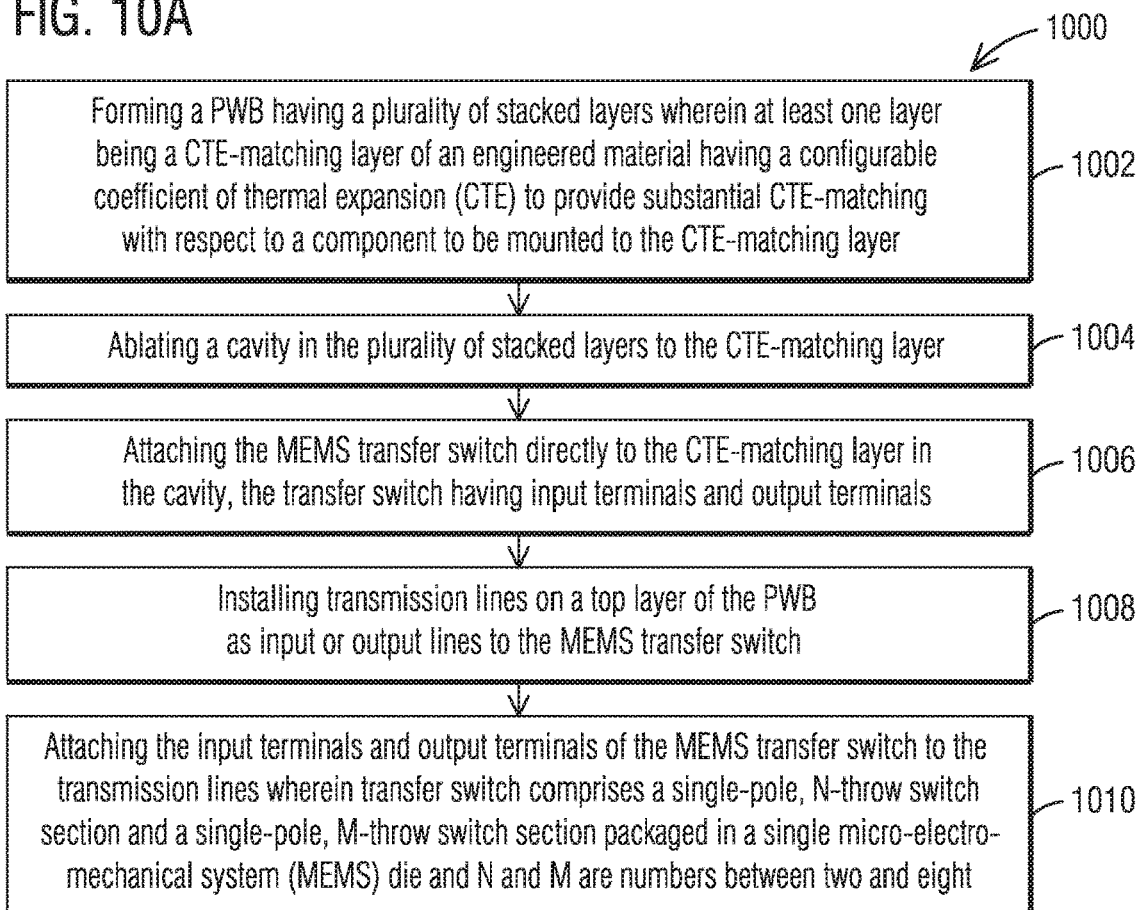
FIGS. 10A-10D illustrate flowcharts of a method of assembling a micro-electro-mechanical system (MEMS) transfer switch on a printed wire board (PWB).
Figure 10B:
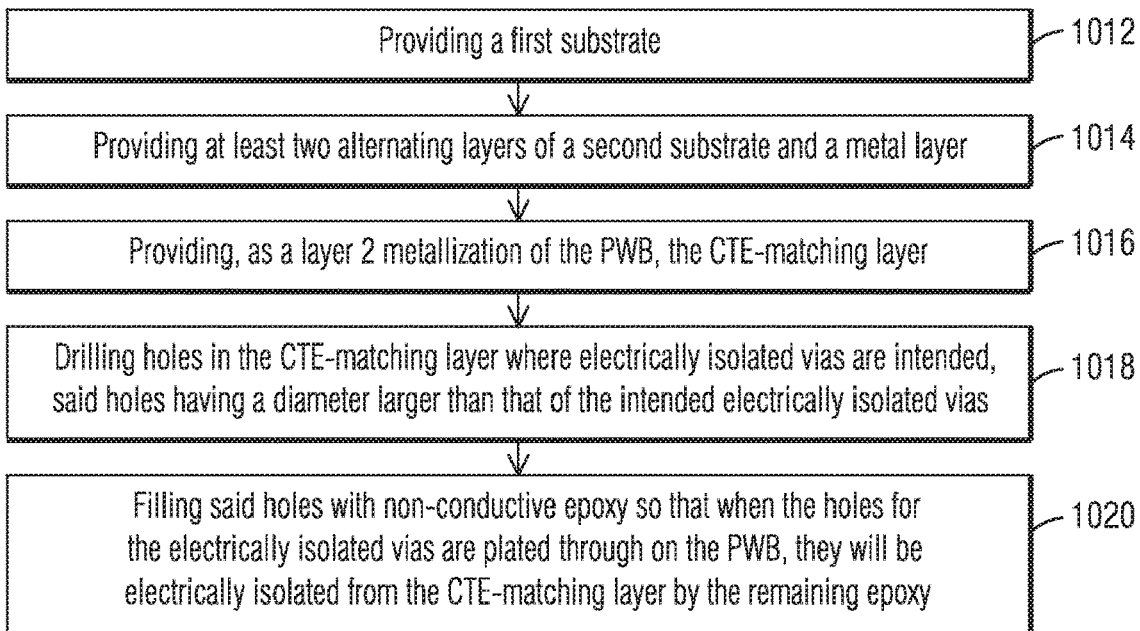
Figure 10C:
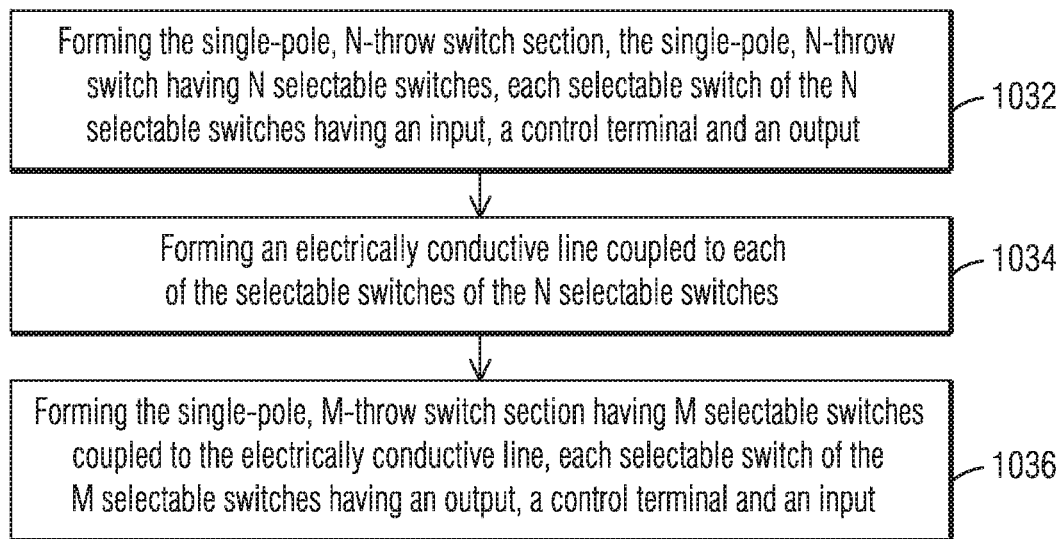

With specific reference to FIG. 10B, the method 1000 may include, at block 1012, when forming the PWB at block 1002, providing a first substrate. The method 1000 may include, at block 1014, when forming the PWB, providing at least two alternating layers of a second substrate and a metal layer. The method 1000 may include, at block 1016, when forming the PWB, providing, as a layer 2 metallization of the PWB, the CTE-matching layer. The method 1000 may include, at block 1018, drilling holes in the CTE-matching layer where electrically isolated vias are intended, said holes having a diameter larger than that of the intended electrically isolated vias. The method 1000 may include, at block 1020, filling said holes with non-conductive epoxy so that when the holes for the electrically isolated vias are drilled and plated through on the PWB, they will be electrically isolated from the CTE-matching layer by the remaining epoxy With specific reference to FIG. 10C, the method 1000 may include, at block 1032, forming the single-pole, N-throw switch section, the single-pole, N-throw switch having N selectable switches, each selectable switch of the N selectable switches having an input, a control terminal and an output. The method 1000 may include, at block 1034, forming an electrically conductive line coupled to each selectable switch of the N selectable switches. The method 1000 may include, at block 1036, forming the single-pole, M-throw switch section having M selectable switches coupled to the electrically conductive line wherein each selectable switch of the M selectable switches having an output, a control terminal and an input.

Figure 10D:
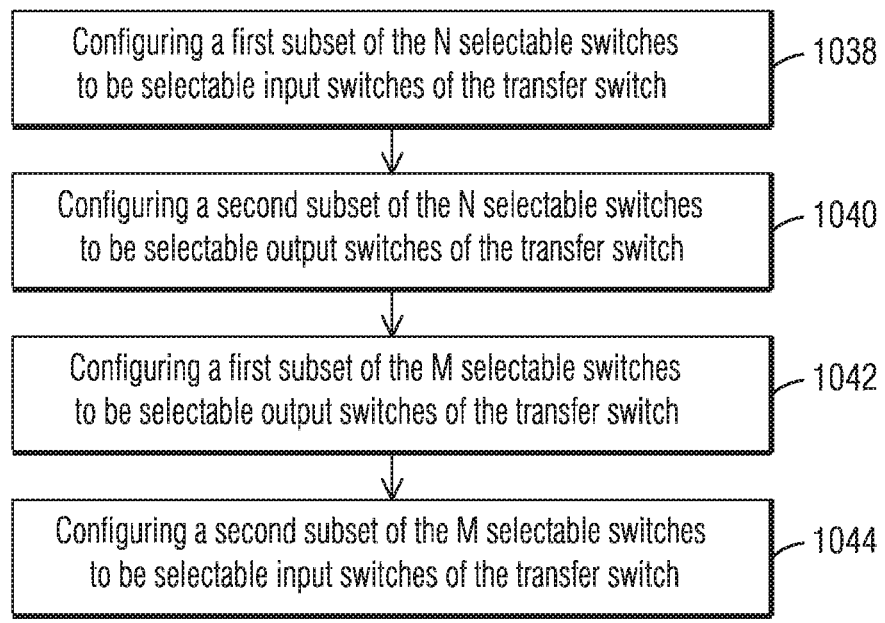

With specific reference to FIG. 10D, the method 1000 may include, at block 1038, configuring a first subset of the N selectable switches to be selectable input switches of the transfer switch. The method 1000 may include, at block 1040, configuring a second subset of the N selectable switches to be selectable output switches of the transfer switch. The method 1000 may include, at block 1042, configuring a first subset of the M selectable switches to be selectable output switches of the transfer switch. The method 1000 may include, at block 1044, configuring a second subset of the M selectable switches to be selectable input switches of the transfer switch. The blocks 1038, 1040, 1042 and 1044 are optional. For example, the first subset of N selectable switches may include N input switches. Thus, block 1040 may be omitted. The first subset of M selectable switches may include M output switches. Hence, block 1044 may be omitted.

In some embodiments, the blocks 1038, 1040, 1042 and 1044 may be performed during the method 900. For example, the blocks 1038, 1040, 1042 and 1044 may be performed prior to block 905.

The "step-by-step process" for performing the claimed functions herein is a specific algorithm, and may be shown as a mathematical formula, in the text of the specification as prose, and/or in a flow chart. The instructions of the software program create a special purpose machine for carrying out the particular algorithm. Thus, in any means-plus-function claim herein in which the disclosed structure is a computer, or microprocessor, programmed to carry out an algorithm, the disclosed structure is not the general purpose computer, but rather the special purpose computer programmed to perform the disclosed algorithm.

A general purpose computer, or microprocessor, may be programmed to carry out the algorithm/steps for creating a new machine. The general purpose computer becomes a special purpose computer once it is programmed to perform particular functions pursuant to instructions from program software of the embodiments described herein. The instructions of the software program that carry out the algorithm/steps electrically change the general purpose computer by creating electrical paths within the device. These electrical paths create a special purpose machine for carrying out the particular algorithm/steps.

Unless otherwise defined, all terms (including technical and scientific terms) used herein have the same meaning as commonly understood by one of ordinary skill in the art to which embodiments belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In particular, unless specifically stated otherwise as apparent from the discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such data storage, transmission or display devices.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising." Moreover, unless specifically stated, any use of the terms first, second, etc., does not denote any order or importance, but rather the terms first, second, etc., are used to distinguish one element from another.

While various disclosed embodiments have been described above, it should be understood that they have been presented by way of example only, and not limitation. Numerous changes, omissions and/or additions to the subject matter disclosed herein can be made in accordance with the embodiments disclosed herein without departing from the spirit or scope of the embodiments. Also, equivalents may be substituted for elements thereof without departing from the spirit and scope of the embodiments. In addition, while a particular feature may have been disclosed with respect to only one of several implementations, such feature may be combined with one or more other features of the other implementations as may be desired and advantageous for any given or particular application. Furthermore, many modifications may be made to adapt a particular situation or material to the teachings of the embodiments without departing from the scope thereof.

Therefore, the breadth and scope of the subject matter provided herein should not be limited by any of the above explicitly described embodiments. Rather, the scope of the embodiments should be defined in accordance with the following claims and their equivalents.

What is claimed is:

1. A method of assembling a micro-electro-mechanical system (MEMS) transfer switch on a printed wire board (PWB), comprising:
    forming a PWB having a plurality of stacked layers wherein at least one layer being a CTE-matching layer of an engineered material having a configurable coefficient of thermal expansion (CTE) to provide substantial CTE matching with respect to a component to be mounted to the CTE matching layer;
    ablating a cavity in the plurality of stacked layers to the CTE-matching layer;
    attaching the MEMS transfer switch directly to the CTE-matching layer in the cavity, the transfer switch having input terminals and output terminals;
    installing transmission lines on a top layer of the PWB as input or output lines to the MEMS transfer switch; and
    attaching the input terminals and output terminals of the MEMS transfer switch to the transmission lines wherein the transfer switch comprises a single-pole, N-throw switch section and a single-pole, M-throw switch section packaged in a single micro-electro-mechanical system (MEMS) die and N and M are numbers between two and eight.

2. The method of claim 1, wherein the forming the PWB comprises:
    providing a first substrate;
    providing at least two alternating layers of a second substrate and a metal layer;
    providing, as a layer 2 metallization of the PWB, the CTE-matching layer;
    drilling holes in the CTE-matching layer where electrically isolated vias are intended, said holes having a diameter larger than that of the intended electrically isolated vias; and
    filling said holes with non-conductive epoxy so that when the holes for the electrically isolated vias are drilled and plated through on the PWB, and being electrically isolate from the CTE-matching layer by the remaining epoxy.

3. The method of claim 1, wherein said CTE-matching layer having substantial heat dissipation properties.

4. The method of claim 3, wherein said CTE-matching layer having a thickness sufficient to substantially dissipate heat related to the MEMS die.

5. The method of claim 1, further comprising:
    forming the single-pole, N-throw switch section, the single-pole, N-throw switch having N selectable switches, each selectable switch of the N selectable switches having an input, a control terminal and an output;
    forming an electrically conductive line coupled to said each selectable switch of the N selectable switches; and
    forming the single-pole, M-throw switch section having M selectable switches coupled to the electrically conductive line, each selectable switch of the M selectable switches having an output, a control terminal and an input.

6. The method of claim 5, further comprising:
    configuring a first subset of the N selectable switches to be selectable input switches of the transfer switch;
    configuring a second subset of the N selectable switches to be selectable output switches of the transfer switch;
    configuring a first subset of the M selectable switches to be selectable output switches of the transfer switch; and
    configuring a second subset of the M selectable switches to be selectable input switches of the transfer switch.

7. The method of claim 5, wherein said CTE-matching layer being configured to receive heat-generating integrated circuit (IC) components.

8. The method of claim 5, wherein the line is a bidirectional line.

9. The method of claim 5, wherein only one of the N first selectable switches is selected at a time; and only one of the M second selectable switches is selected at a time.

10. The method of claim 5, wherein the single-pole, N-throw switch section is a mirror image of the single-pole, M-throw switch section and the N and the M are equal to four.

11. The method of claim 1, wherein the single-pole, N-throw switch section has an input terminal, a control terminal and an output terminal such that the single-pole, N-throw switch section includes N selectable inputs and N selectable outputs.

12. The method of claim 1, wherein the single-pole, M-throw switch section has an output terminal, a control terminal and an input terminal such that the single-pole, M-throw switch section includes M selectable inputs coupled to an electrically conductive line and M selectable outputs.

* * * * *